(12) United States Patent
Glenn et al.

(10) Patent No.: US 6,528,869 B1
(45) Date of Patent: Mar. 4, 2003

(54) SEMICONDUCTOR PACKAGE WITH MOLDED SUBSTRATE AND RECESSED INPUT/OUTPUT TERMINALS

(75) Inventors: Thomas P. Glenn, Gilbert, AZ (US); Roy D. Hollaway, Chandler, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 0 days.

(21) Appl. No.: 09/827,619

(22) Filed: Apr. 6, 2001

(51) Int. Cl.[7] ............................................. H01L 23/02
(52) U.S. Cl. ...................... 257/678; 324/755; 219/209; 257/685; 257/686; 257/780; 257/784
(58) Field of Search ................................ 257/685, 686, 257/692, 711, 723, 737, 779, 784; 438/108, 106, 109; 324/755; 219/209

(56) References Cited

U.S. PATENT DOCUMENTS

| | | | |
|---|---|---|---|
| 5,104,480 A | 4/1992 | Wojnarowski et al. ...... | 156/643 |
| 5,838,060 A | 11/1998 | Comer ........................ | 257/685 |
| 6,172,423 B1 * | 1/2001 | Lee ............................. | 257/685 |
| 6,188,232 B1 * | 2/2001 | Akram et al. ................ | 324/755 |
| 6,329,637 B1 * | 12/2001 | Hembree et al. ........... | 219/209 |

* cited by examiner

*Primary Examiner*—David Nelms
*Assistant Examiner*—Mai-Huong Tran
(74) *Attorney, Agent, or Firm*—Skjerven Morrill LLP; James E. Parsons; Robert D. Wasson

(57) ABSTRACT

Semiconductor chip packages having molded plastic substrates and recessed I/O terminals are disclosed, along with methods of making such packages. In an exemplary embodiment, the molded plastic substrate includes a metal interconnect pattern and a plurality of indentations in a surface thereof. Each indentation may include at least one projection. The indentation and any projections therein are covered by a metal lining. A metal contact, which serves as an I/O terminal, is placed in each of the indentations and is fused to the metal lining thereof. A chip is mounted on the substrate and is electrically connected to the metal contacts by the interconnect pattern. The package further includes a lid or hardened encapsulant over the chip.

33 Claims, 4 Drawing Sheets

US 6,528,869 B1

SEMICONDUCTOR PACKAGE WITH MOLDED SUBSTRATE AND RECESSED INPUT/OUTPUT TERMINALS

BACKGROUND

1. Field of the Invention

The present invention relates to packages for semiconductor chips or other electronic devices.

2. Description of the Related Art

Ball grid array (BGA) packages are used for many types of semiconductor chips, including vision and microelectromechanical (MEM) chips, for various applications. A typical BGA package for a semiconductor chip includes a printed circuit board substrate upon which the chip is mounted. The printed circuit board includes a core sheet of a glass-fiber filled epoxy laminate. Conductive metal traces are provided on upper and lower surfaces of the core layer. The chip is electrically connected to the upper traces by bond wires or the like. Metal vias electrically connect the upper and lower circuit traces through the substrate. The circuit traces on the lower surface of the substrate each extend from one of the vias to a planar metal ball land. A metal ball (e.g., solder ball) is fused to each of the ball lands. The metal balls serve as input/output (I/O) terminals for the package. A hardened encapsulant material covers the chip and a portion of the upper surface of the printed circuit board substrate.

The above-described package has numerous drawbacks. First, it is relatively expensive to make, due to the relatively complex printed circuit board substrate. Second, the contact area between each metal ball and its respective land is small, leading to decreased reliability as the contact area reduces with the finer contact pitches of successive generations. Third, the fused connection between each of the metal balls and its respective ball land is subject to shearing forces that can result in package failure due to an open circuit. Accordingly, a less expensive, more reliable package is desirable.

SUMMARY

The present invention involves packages that include a semiconductor chip mounted on a molded plastic substrate. The molded plastic substrate includes a plurality of indentations, each having a metal lining, in a first side thereof. A plurality of reflowable metal contacts, which may be in the form of solder balls, are each placed within a respective one of the indentations and fused to the metal lining of the indentation. The reflowable metal contacts serve as I/O terminals of the package. The substrate further includes a plurality of conductive paths each electrically connected between the chip and the metal contact of a respective one of the indentations. Each indentation may further include one or more projections that are also covered by the metal lining therein. The projections extend into the metal contact.

By comparison to conventional BGA packages, the packages of the present invention avoid the high cost of a printed circuit board through the use of a molded plastic substrate. In addition, the metal contacts (e.g., balls) are protected from shearing off the substrate by their placement in the indentations. In addition, the indentations, including any projections therein, increase the metalized surface area of the substrate to which the metal balls are fused, which results in a stronger bond between the substrate of the package and the metal contacts. The present invention thus can increase package yields and package reliability compared to prior art methods.

These and other aspects and features of the present invention will be better understood in view of the following detailed description of the exemplary embodiments and the drawings thereof.

BRIEF DESCRIPTION OF THE DRAWINGS

In the drawings, like or similar features are typically labeled with the same reference numbers.

DETAILED DESCRIPTION

Figure 1:
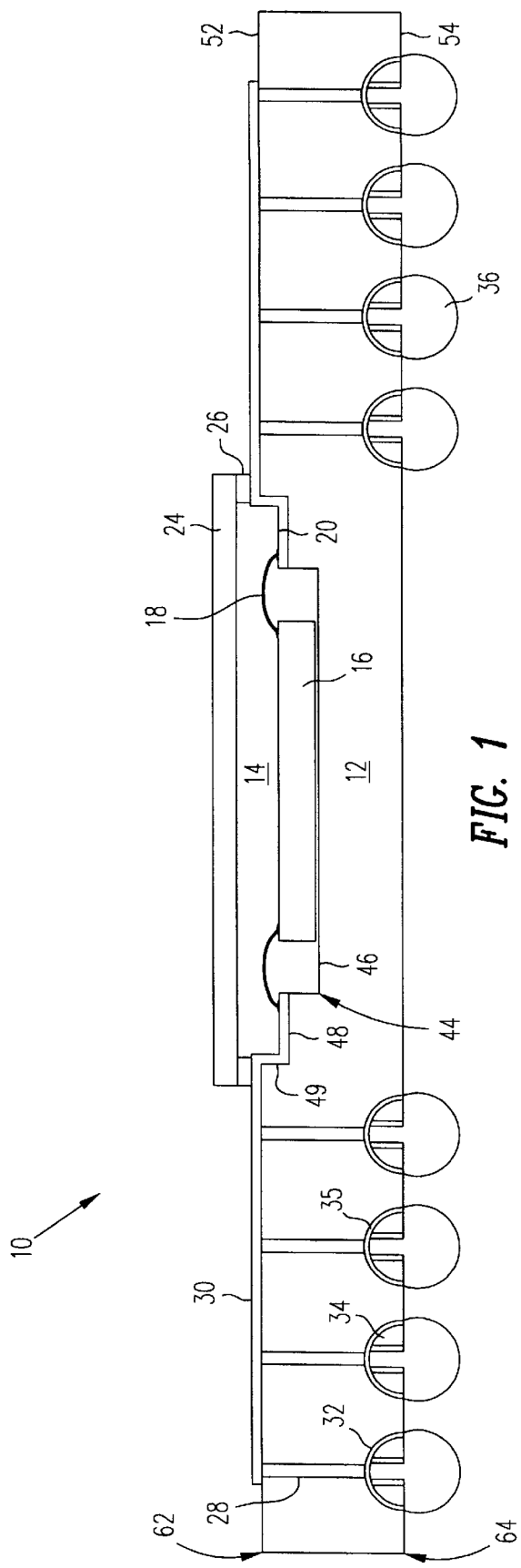
FIG. 1 is a cross-sectional side view of a semiconductor package having a molded plastic substrate and recessed I/O terminals according to one embodiment of the present invention.

FIG. 1 is a cross-sectional side view of a semiconductor package 10 having a molded plastic substrate and recessed I/O terminals, in accordance with one embodiment of the present invention. Package 10 includes a molded plastic substrate 12, which may be formed, for example, of an injection molded liquid crystal polymer material. Substrate 12 includes a horizontal first exterior surface 52 on an upper first side 62 of substrate 12, and a horizontal second exterior surface 54 on an opposite lower second side 64 of substrate 12.

Substrate 12 also includes a central recess 44 in first side 62 of substrate 12. Recess 44 includes a bottom horizontal first interior surface 46 and an intermediate horizontal second interior surface 48 between first interior surface 46 and first exterior surface 52.

Substrate 12 also includes a plurality of indentations 32 in second exterior surface 54 of second side 64. Indentations 32 may be arrayed in rows and columns in second exterior surface 54. In the embodiment of FIG. 1, at least one projection 34 (see also FIGS. 2–4) extends from the inner semispherical wall of indentation 32. In another embodiment, not shown, such projections may be omitted such that indentation 32 has a smooth semispherical inner wall.

A conductive metal (e.g., copper) interconnect pattern is also provided on and through substrate 12. The interconnect pattern includes a plurality of exposed metal leadfingers 20 on second interior surface 48 of recess 44. Leadfingers 20 are electrically connected to a plurality of conductive metal traces 30 that extend upward from second interior surface 48 along an orthogonal wall 49 of recess 44 and onto first exterior surface 52 of substrate 12. Each trace 30 on first exterior surface 52 is electrically connected to a respective one of a plurality of metallized vias 28 that extend vertically through substrate 12. An opposite end of each via 28 is electrically connected to a respective metal lining 35 (shown in FIG. 2) that lines each indentation 32. Metal lining 35 covers the inner wall of the respective indentation 32, including covering any projections 34 that extend from the inner wall.

A semiconductor chip 16 is attached to first interior surface 46 within recess 44 using an adhesive. Chip 16 is electrically connected to respective leadfingers 20 of the interconnect pattern of substrate 12 using, for example, a plurality of metal wire bonds 18.

A plurality of reflowable metal balls 36 that are each within an indentation 32 on second side 64 of substrate 12 serve as the I/O terminals of package 10. Each metal ball 36 is partially recessed within an indentation 32, and is fused to the metal lining 35 therein. The metal-lined projection(s) 34 of the respective indentation 32 extend into the metal ball 36. Metal balls 36 may be formed of lead tin solder, or some other metal. Providing metal balls 36 within indentations 32 increases the surface area of the contact between metals balls 36 and indentations 32 and protects the metal balls 36 from shearing forces, resulting in a more reliable package than the prior art.

Leadfingers 20, conductive metal traces 30, vias 28, and metal linings 35 of indentations 32 together form electrically conductive paths on and through substrate 12. The conductive paths route signals between chip 16 and the I/O terminals (e.g., metal balls 36) of package 10. Practitioners will appreciate that the interconnect pattern of substrate 12 can vary, both in its constituent parts and layout, as appropriate for chip 16 and the package application.

A planar lid 24 is sealed to first exterior surface 52 of substrate 12 over recess 44 with an insulative adhesive seal 26. Lid 24 may be formed, for example, of a transparent material (e.g. glass) where chip 16 is an optical device, or an opaque material (e.g. metal or ceramic) where chip 16 is a memory device, MEMs, or other type of semiconductor chip. Together, lid 24 and recess 44 of substrate 12 define a closed cavity 14 within which chip 16 is enclosed. Seal 26 may be formed of a bead of an epoxy or other adhesive, a double-sided tape, or an adhesive film.

In an alternative embodiment, lid 24 may be replaced by a hardened insulative encapsulant material that is provided in recess 44 over chip 16 and bond wires 18. Where chip 16 is an optical device, the encapsulant material may be transparent so as to transmit light to or from chip 16. The encapsulant material may be a liquid encapsulant material or a glob top material.

Figure 2:
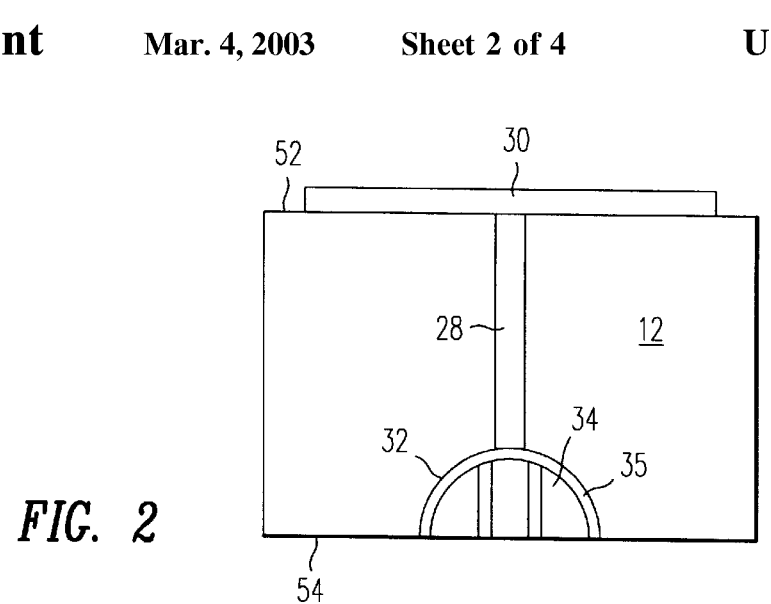
FIG. 2 is a cross-sectional side view of an indentation in a lower surface of the substrate of the package of FIG. 1.

FIG. 2 is a cross-sectional side view of one indentation 32 in second exterior surface 54 of substrate 12 of package 10 of FIG. 1. Metallized via 28, which extends completely through substrate 12, electrically connects a trace 30 on first exterior surface 52 of substrate 12 to metal lining 35 of indentation 32.

Figure 3:
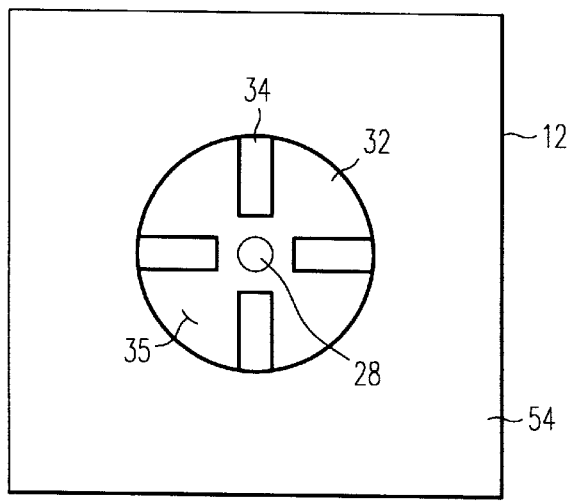
FIG. 3 is a bottom plan view of the indentation of FIG. 2.

In the exemplary embodiment of FIG. 2, each indentation 32 includes at least one optional projection 34 covered by metal lining 35, or more typically, a plurality of projections 34 covered by metal lining 35 (see FIG. 3). Each projection 34 extends from the interior surface of indentation 32 into the open interior of indentation 32. However, in this example, projections 34 do not extend beyond the plane of second exterior surface 54 of substrate 12. Projections 34 are quarter-circular in side profile with dimensions designed to maximize their surface area.

FIG. 3 is a bottom plan view of one indentation 32 in second exterior surface 54 of substrate 12 of package 10 of FIG. 1. Via 28 through substrate 12 is centrally positioned in indentation 32. Four projections 34 are positioned at right angles to each other around via 28. Practitioners will appreciate that the number and arrangement of projections 34 in indentation 32 can vary.

Figure 4:
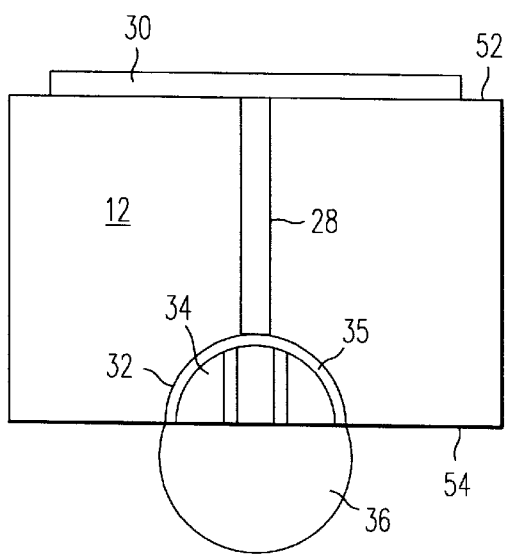
FIG. 4 is a cross-sectional side view of the indentation of FIG. 2 with a metal ball attached therein.

FIG. 4 is a cross-sectional side view of metal ball 36 fused to metal lining 35 of one indentation 32 in second exterior surface 54 of substrate 12. As stated above, metal ball 36 is thereby electrically connected to via 28 that contacts metal lining 35, and ultimately is electrically connected to chip 16. The four projections 34 of indentation 32 extend into metal ball 36 (see FIG. 3 and FIG. 4).

By having projections 34, the interior surface area of indentation 32 is increased beyond the surface area that would be present in a smooth semispherical indentation in substrate 12. The increased surface area of indentation 32 allows a stronger adhesion of metal ball 36 to substrate 12, and in particular, a stronger adhesion of metal ball 36 to metal lining 35 that lines indentation 32.

To make package 10, a metal-less substrate 12, including first exterior surface 52, second exterior surface 54, and recess 44, is initially formed. Substrate 12 may be formed, for example, by injection molding a plastic material, such as liquid crystal polymer. Liquid crystal polymer is capable of sustaining high temperatures and can easily be molded and embossed. Typically, recess 44 is molded into substrate 12.

Substrate 12, or an integral matrix of several substrates 12 that later will be cut apart, is then passed through a heated roller that has bumps shaped with negative impressions of indentations 32. Passing substrate 12 through the heated roller transfers the pattern of bumps into second exterior surface 54 of substrate 12. The bumps on the roller include recesses that result in projections 34 being formed in embossed indentations 32. Indentations 32 may have a radius of 0.2–0.57 mm.

In an alternative embodiment, recess 44 can be embossed into first exterior surface 52 of substrate 12 by the same heated roller used to form indentations 32 rather than being molded into substrate 12. In a further alternative embodiment, recess 44 and indentations 32 can be provided during the molding of substrate 12.

Subsequently, holes for vias 28 are formed (e.g., laser drilled or punched) through substrate 12. Each such hole extends from first exterior surface 52 into a respective one of indentations 32.

Subsequently, the surfaces of substrate 12, including at least first exterior surface 52, second exterior surface 54, second interior surface 48, and the interior surfaces of indentations 32 (including any projections 34), are roughened to improve adhesion to a metal plated thereon in a subsequent processing step. The metal, which in our example is copper, is plated onto substrate 12 using an electroless plating technique so as to cover the entire area of substrate 12. The metal lines vias 28 and the interior surface areas of indentations 32, including projections 34. The metal may actually fill vias 28 if vias 28 have sufficiently small diameter, which may result, for example, from laser drilling. The metal is then masked using conventional photolithography techniques and etched to define leadfingers 20, traces 30, and metal linings 35 through the removal of unwanted metal. Nickel and gold are then selectively plated onto conductive metal traces 30 and metal linings 35.

Alternatively, the copper, nickel, and gold may be successively plated onto substrate 12 before patterning using an etch-back technique. In this case, the gold is patterned using conventional photolithography techniques and then used as a mask for laser etching of the nickel and gold.

Next, chip 16 is placed within recess 44 and attached to planar first interior surface 46 using an adhesive. Chip 16 is electrically connected to leadfingers 20 by bond wires 18 using a conventional wire bonding machine. Planar lid 24 is provided over recess 44 and is sealed to first exterior surface 52 of substrate 12 fully around recess 44, thereby forming cavity 14.

Metal balls 36, each of which serves as an external I/O terminal of package 10, are respectively placed within respective indentations 32 and substrate 12 is heated slightly to fuse the metal of metal balls 36 to metal linings 35 of indentations 32. Metal balls 36 are partially recessed within respective indentations 32, thereby forming recessed I/O terminals of package 10.

Alternatively, instead of metal balls, a solder paste may be screened onto second exterior surface 54 to form the external I/O terminals of package 10. In this case, the solder paste completely fills indentations 32, but does not extend, or extends only a small amount, beyond second exterior surface 54. Once package 10 is placed, for example, on a motherboard, package 10 is heated slightly, and the solder paste forms into balls forming a fused connection between metal linings 35 and the contact lands on the motherboard.

Figure 5:
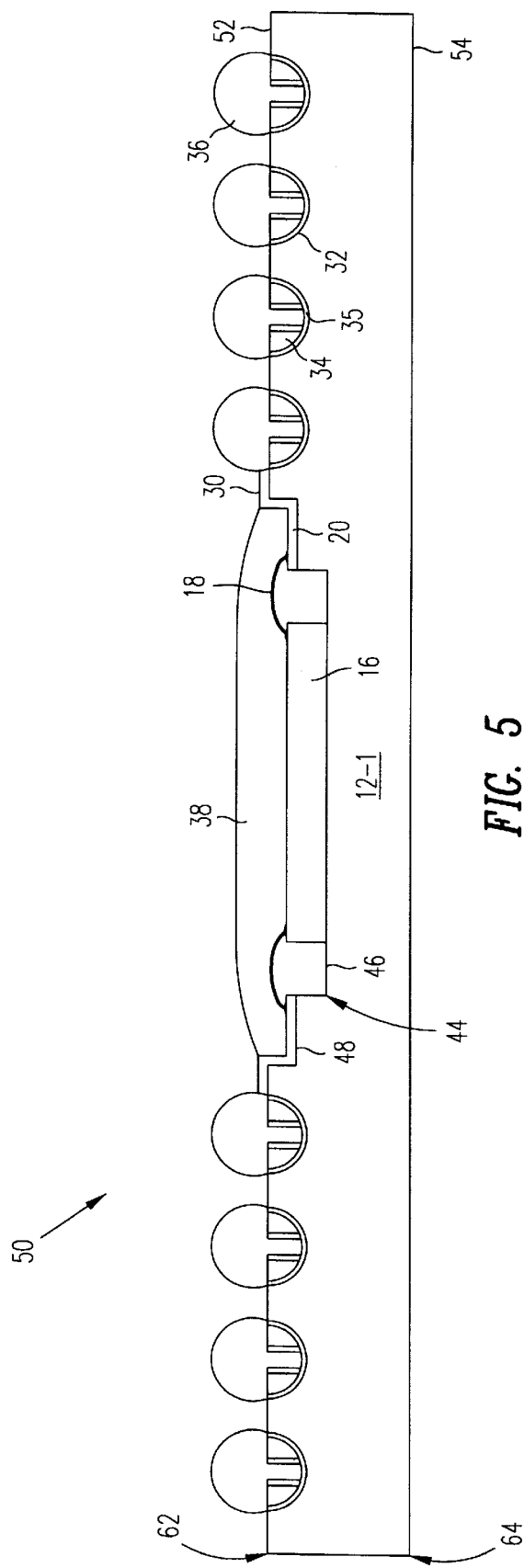
FIG. 5 is a cross-sectional side view of a semiconductor package having a molded plastic substrate and recessed I/O terminals according to another embodiment of the present invention.

FIG. 5 is a cross-sectional side view of a semiconductor package 50 in accordance with another embodiment of the present invention. Package 50 is similar to package 10 of FIGS. 1, 2, 3, and 4, includes most of the same features, and is labeled with many similar reference numbers. Accordingly, to avoid redundancy, our discussion will focus on differences between package 50 and package 10.

Package 50 includes a molded plastic substrate 12-1 similar to substrate 12 of FIG. 1, but unlike substrate 12, substrate 12-1 of FIG. 5 does not include vias 28. Substrate 12-1 includes first exterior surface 52 on first side 62 of substrate 12-1 and second exterior surface 54 on opposite second side 64 of substrate 12-1. Substrate 12-1 also includes recess 44 with first interior surface 46, upon which semiconductor chip 16 is mounted, and second interior surface 48.

Substrate 12-1 of package 50 has an interconnect pattern similar to substrate 12 of package 10 of FIG. 1, to route signals between chip 16 and the I/O terminals (e.g., metal balls 36) of the package. The interconnect pattern include leadfingers 20 on second interior surface 48, conductive metal traces 30 on first exterior surface 52, and metal linings 35 of indentations 32. Metal balls 36 are respectively fused to metal linings 35 within respective indentations 32. Chip 16 is mounted within recess 44 and is electrically connected to leadfingers 20 of the interconnect pattern using wire bonds 18. When package 50 is mounted on a motherboard or the like, chip 16 faces the motherboard.

In package 50, chip 16, wire bonds 18, leadfingers 20, and a portion of substrate 12-1 are shown enclosed in a hardened insulative encapsulant 38 that is within recess 44. Encapsulant 38 may be a poured liquid encapsulant material, in which case a dam of adhesive material may be provided on first exterior surface 52 around recess 44. Alternatively, encapsulant 38 can be a glob top material or a molded material. In an alternative embodiment, encapsulant 38 may be replaced, for example, with a lid sealed to substrate 12-1 similar to package 10 of FIG. 1.

Substrate 12-1 and package 50 of FIG. 5 are made similarly to substrate 12 and package 10 of FIG. 1, respectively. Accordingly, to avoid redundancy, our discussion will focus on differences in the assembly of package 50 and package 10. The chief difference between substrate 12-1 of package 50 and substrate 12 of package 10 is that indentations 32 and projections 34 are embossed into first exterior surface 52 of first side 62 of substrate 12-1, rather than into second exterior surface 54 of second side 64, as was done for substrate 12 of package 10 of FIG. 1. Accordingly, both chip 16 and metal balls 36 are on first side 62 of substrate 12-1. Since the I/O terminals of package 50 are formed on the same side of substrate 12-1 where chip 16 is located, no vias 28 are needed through substrate 12-1. In addition, as mentioned above, a liquid encapsulant material, glob top encapsulant material, or molded encapsulant material is provided in recess 44 of package 50 and cured, thereby forming hardened encapsulant 38. Encapsulant 38 covers chip 16, wire bonds 18, leadfingers 20, and optionally a small portion of first exterior surface 52 of substrate 12-1 around recess 44.

Figure 6:
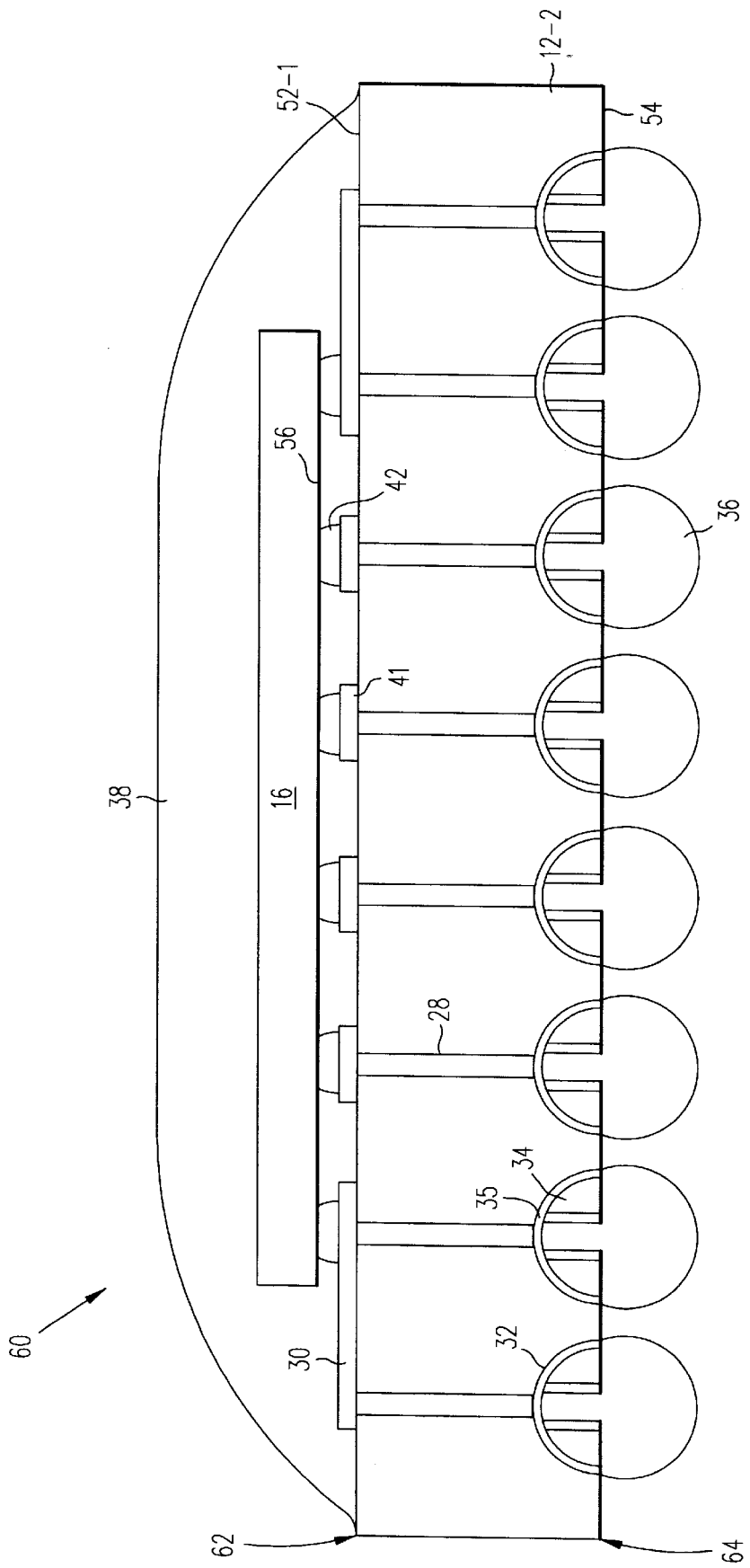
FIG. 6 is a cross-sectional side view of a semiconductor package having a molded plastic substrate and recessed I/O terminals according to another embodiment of the present invention.

FIG. 6 is a cross-sectional side view of a semiconductor package 60 in accordance with still another embodiment of the present invention. Package 60 is similar to package 10 of FIGS. 1, 2, 3, and 4, includes most of the same features, and is labeled with many similar reference numbers. Accordingly, to avoid redundancy, our discussion will focus on differences between package 60 and package 10.

Package 60 includes a molded plastic substrate 12-2, which, unlike substrate 12 of FIG. 1, does not include recess 44. Substrate 12-2 includes a planar first exterior surface 52-1 on first side 62 of substrate 12-2 and second exterior surface 54 on opposite second side 64 of substrate 12-2.

Semiconductor chip 16 is mounted in a flip chip style on first exterior surface 52-1 of substrate 12-2. Bond pads (not shown) on an active surface 56 of chip 16 are each electrically connected by a respective metal bump 42 (e.g., solder bump) to a respective planar land 41 on first exterior surface 52-1 of substrate 12-2. Each land 41 is integrally connected to an upper end of one of vias 28 or to one of conductive metal traces 30 on first exterior surface 52-1. Traces 30 are each in turn electrically connected to a respective one of vias 28. As above, vias 28 respectively extend through substrate 12-2 and electrically connect to metal linings 35 that line the inner walls and projections 34 of indentations 32 in second exterior surface 54 of substrate 12-2. Metal balls 36, which serve as external I/O terminals, are fused to metal lining 35 of respective indentations 32.

Lands 41, conductive metal traces 30, vias 28, and metal linings 35 in indentations 32 form conductive paths on and through substrate 12-2 to route signals between chip 16 and the I/O terminals (metal balls 36). Typically, lands 41, traces 30, vias 28, and metal linings 35 are formed of copper, and at least lands 41 and metal linings 35 may be plated with nickel and gold.

Chip 16, metal bumps 42, and a portion of substrate 12-2 are shown enclosed in a hardened encapsulant 38, which may be a liquid encapsulant or a glob top material. Alternatively, encapsulant 38 may be replaced, for example, with a lid sealed to substrate 12-2. The lid would necessarily include a recess so that together, the lid and substrate 12-2 would define a cavity within which chip 16 is enclosed.

Package 60 of FIG. 6 is made similarly to package 10 of FIG. 1. Accordingly, to avoid redundancy, our discussion will focus on differences in the assembly of package 60 and package 10. One of the chief differences in the method of making package 60 is that lands 41 must be formed at the time conductive metal traces 30 are being formed on first exterior surface 52-1. Further, chip 16 is mounted on lands 41 of first exterior surface 52-1 in a flip chip style, thus eliminating the need for wire bonds. A final difference is that rather than enclosing chip 16 with a lid, as in package 10 of FIG. 1, encapsulant 38 is applied onto first exterior surface 52-1 of substrate 12-2 and cured to harden, similar to package 50 of FIG. 5.

In the various exemplary embodiments described herein, the metal balls that serve as external I/O terminals of the BGA packages are each partially recessed within an indentation of a molded plastic substrate, and are each fused therein to a metal lining that is part of the interconnect pattern of the substrate. Optional projections within the indentation increase the metalized surface area of the substrate to which the metal balls are fused, which results in a stronger bond between the substrate of the package and the metal balls. The provision of the metal balls partially recessed in the indentations also provides a measure of physical protection to the metal balls, thereby preventing damage to the metal balls from handling of the package. The present invention thus increases package yields and package reliability compared to prior art methods of metal ball bonding.

Having completed our discussion of the exemplary embodiments, we claim our invention as follows. Practitioners may see variations possible in the packages and ideas described herein. Accordingly, our invention is not limited to the examples described herein, but rather includes all that fits within the literal and equitable scope of the appended claims.

We claim:

1. A semiconductor package comprising:
    a semiconductor chip mounted on a molded plastic substrate, wherein said substrate has a plurality of indentations in a first side thereof, each of said indentations having a metal lining;
    a plurality of reflowable metal contacts each partially within a respective one of said indentations and fused to said metal lining of said indentation; and
    a plurality of conductive parts attached to said substrate, wherein each of said conductive paths is electrically connected between said chip and said metal contact of a respective one of said indentations.

2. The semiconductor package of claim 1, wherein each of said indentations includes at least one projection covered by said metal lining, which at least one projection extends into said metal contact.

3. The semiconductor package of claim 1, wherein each of said indentations includes a plurality of projections each covered by said metal lining, which projections extend into said metal contact.

4. The semiconductor package of claim 1, wherein said package further comprises a hardened encapsulant over said chip.

5. The semiconductor package of claim 1, wherein said package further comprises a lid sealed to said substrate, wherein said substrate and said lid define a cavity enclosing said chip.

6. The semiconductor package of claim 5, wherein said lid is transparent and said chip is an optical device.

7. The semiconductor package of claim 1, wherein said substrate is formed of an injection molded liquid crystal polymer material.

8. The semiconductor package of claim 1, wherein said chip is mounted on said first side.

9. The semiconductor package of claim 1, wherein said chip is mounted on a second side of said substrate opposite said first side.

10. The semiconductor package of claim 9, wherein each of said plurality of conductive paths extends at least in part through said substrate from said first side to said second side.

11. The semiconductor package of claim 1, wherein said metal contacts each have a form of a ball.

12. The semiconductor package of claim 1, wherein said metal contacts each comprise a solder paste in a respective one of said indentations.

13. A semiconductor package comprising:
    a molded plastic substrate having a first side and an opposite second side, wherein said substrate has a plurality of indentations in said second side, each of said indentations having a metal lining;
    a semiconductor chip mounted on said first side;
    a plurality of reflowable metal contacts each partially within a respective one of said indentations and fused to said metal lining of said indentation; and
    a plurality of conductive paths on said first side of said substrate and extending at least in part through said substrate from said first side to said second side, wherein each of said conductive paths is electrically connected between said chip and said metal contact of a respective one of said indentations.

14. The semiconductor package of claim 13, wherein each of said indentations includes at least one projection covered by said metal lining, which at least one projection extends into said metal contact.

15. The semiconductor package of claim 13, wherein each of said indentations includes a plurality of projections each covered by said metal lining, which projections extend into said metal contact.

16. The semiconductor package of claim 13, wherein said package further comprises a hardened encapsulant over said chip.

17. The semiconductor package of claim 13, wherein said package further comprises a lid sealed to said first side of said substrate, wherein said substrate and said lid define a cavity enclosing said chip.

18. The semiconductor package of claim 17, wherein said lid is transparent and said chip is an optical device.

19. The semiconductor package of claim 13, wherein said substrate is formed of an injection molded liquid crystal polymer material.

20. A semiconductor package comprising:
    a molded plastic substrate including a first side with a plurality of indentations therein, wherein each of said indentations has at least one projection extending from an inner wall thereof, and said indentation and said at least one projection are covered by a metal lining;
    a semiconductor chip mounted on said first side;
    a plurality of reflowable metal balls each partially within a respective one of said indentations and fused to said metal lining of said indentation and said at least one projection; and
    a plurality of conductive paths on said first side of said substrate, wherein each of said plurality of conductive paths is electrically connected between said chip and said metal ball of a respective one of said indentations.

21. The semiconductor package of claim 20, wherein said package further comprises a hardened encapsulant over said chip.

22. The semiconductor package of claim 20, wherein said package further comprises a lid sealed to said first side of said substrate, wherein said substrate and said lid define a cavity enclosing said chip.

23. A semiconductor package comprising:
    a molded plastic substrate including a first side and an opposite second side with a plurality of indentations therein, wherein each of said indentations has at least one projection extending from an inner wall thereof, and said indentation and said at least one projection are covered by a metal lining;

a plurality of reflowable metal contacts each partially within a respective one of said indentations and fused to said metal lining of said indentation and said at least one projection;

a plurality of conductive paths on said first side of said substrate and extending at least in part through said substrate from said first side to said second side, wherein each of said plurality of conductive paths is electrically connected to said metal contact of a respective one of said indentations; and a semiconductor chip on said first side of said substrate in a flip-chip electrical connection with a portion of said conductive paths.

24. The semiconductor package of claim 23, wherein said package further comprises a hardened encapsulant over said chip.

25. The semiconductor package of claim 23, wherein said package further comprises a lid having a central recess sealed to said first side of said substrate, wherein said substrate and lid define a cavity enclosing said chip.

26. A semiconductor package comprising:

a molded plastic substrate, wherein said substrate has a plurality of indentations molded in a first side thereof, said indentations each having a metal lining;

a semiconductor chip mounted on the molded plastic substrate and electrically coupled to the metal lining of the indentations; and a plurality of electrically conductive contacts each partially within a respective one of said indentations and electrically coupled to the metal lining within the indentation.

27. The semiconductor package of claim 26, wherein at least one molded plastic projection of said molded plastic substrate extends from a semispherical wall of each said indentation, with each said projection being covered by said metal lining, and said at least one projection extends into the respective contact.

28. The semiconductor package of claim 27, wherein said molded plastic substrate includes a plurality of the molded plastic projections within each said indentation.

29. The semiconductor package of claim 27, wherein the contacts are metal balls fused to the metal lining of the respective indentation.

30. The semiconductor package of claim 26, wherein the semiconductor chip is on a same side of the molded plastic substrate as the indentations.

31. The semiconductor package of claim 26, wherein the semiconductor chip is on an opposite side of the molded plastic substrate as the indentations.

32. The semiconductor package of claim 31, wherein an electrically conductive via extends vertically through the substrate, with said via being electrically coupled between the semiconductor chip and the metal lining of at least some of the indentations.

33. The semiconductor package of claim 26, wherein a metal trace overlying an outer surface of the molded plastic body is electrically coupled between the semiconductor chip and the metal lining at least some of the indentations.

* * * * *